(12) United States Patent
Dünkel et al.

(10) Patent No.: US 12,268,019 B2
(45) Date of Patent: Apr. 1, 2025

(54) FERROELECTRIC FIELD-EFFECT TRANSISTORS WITH A HYBRID WELL

(71) Applicant: GlobalFoundries Dresden Module One Limited Liability Company & Co. KG, Dresden (DE)

(72) Inventors: Stefan Dünkel, Dresden (DE); Dominik Martin Kleimaier, Dresden (DE); Zhixing Zhao, Dresden (DE); Halid Mulaosmanovic, Dresden (DE)

(73) Assignee: GlobalFoundries Dresden Module One Limited Liability Company & Co. KG, Dresden (DE)

( * ) Notice: Subject to any disclaimer, the term of this patent is extended or adjusted under 35 U.S.C. 154(b) by 0 days.

(21) Appl. No.: 17/960,245

(22) Filed: Oct. 5, 2022

(65) Prior Publication Data

US 2024/0120420 A1    Apr. 11, 2024

(51) Int. Cl.
| | |
|---|---|
| *H01L 29/66* | (2006.01) |
| *H01L 21/74* | (2006.01) |
| *H10D 30/01* | (2025.01) |
| *H10D 30/69* | (2025.01) |
| *H10D 62/17* | (2025.01) |
| *H10D 64/68* | (2025.01) |

(52) U.S. Cl.
CPC ........... *H10D 30/701* (2025.01); *H01L 21/74* (2013.01); *H10D 30/0415* (2025.01); *H10D 62/371* (2025.01); *H10D 64/689* (2025.01)

(58) Field of Classification Search
CPC .............. H01L 29/78391; H01L 21/74; H01L 29/1083; H01L 29/516; H01L 29/6684
USPC ......................................................... 257/295
See application file for complete search history.

(56) References Cited

U.S. PATENT DOCUMENTS

| | | | | |
|---|---|---|---|---|
| 6,107,656 A | * | 8/2000 | Igarashi ................. | H10B 51/00 257/295 |
| 6,339,238 B1 | * | 1/2002 | Lim ........................ | G11C 11/22 257/295 |
| 6,674,110 B2 | * | 1/2004 | Gnadinger ............. | H10B 53/00 257/295 |

(Continued)

OTHER PUBLICATIONS

T. Ali et al., "A Multilevel FeFET Memory Device based on Laminated HSO and HZO Ferroelectric Layers for High-Density Storage," 2019 IEEE International Electron Devices Meeting (IEDM), 2019, pp. 28.7.1-28.7.4, doi: 10.1109/IEDM19573.2019.8993642.

(Continued)

*Primary Examiner* — Sheikh Maruf
(74) *Attorney, Agent, or Firm* — Thompson Hine LLP

(57) ABSTRACT

Structures including a ferroelectric field-effect transistor and methods of forming a structure including a ferroelectric field-effect transistor. The structure comprises a semiconductor substrate, a semiconductor layer, a dielectric layer arranged between the semiconductor layer and the semiconductor substrate, and first and second wells in the semiconductor substrate. The first well has a first conductivity type, and the second well has a second conductivity type opposite to the first conductivity type. A ferroelectric field-effect transistor comprises a gate structure on the semiconductor layer over the first well and the second well. The gate structure includes a ferroelectric layer comprising a ferroelectric material.

20 Claims, 2 Drawing Sheets

(56) References Cited

U.S. PATENT DOCUMENTS

| | | | | |
|---|---|---|---|---|
| 6,737,689 | B1* | 5/2004 | Schlosser | H01L 29/516 |
| | | | | 438/785 |
| 6,790,679 | B2* | 9/2004 | Dimmler | H01L 29/792 |
| | | | | 438/257 |
| 6,858,444 | B2* | 2/2005 | Ahn | H01L 29/40111 |
| | | | | 438/785 |
| 6,888,736 | B2* | 5/2005 | Dimmler | H10B 53/00 |
| | | | | 257/E29.272 |
| 6,906,366 | B2* | 6/2005 | Hsu | H01L 21/02197 |
| | | | | 257/295 |
| 9,570,551 | B1* | 2/2017 | Balakrishnan | H01L 29/66469 |
| 9,748,385 | B1* | 8/2017 | Balakrishnan | H01L 29/42392 |
| 9,954,058 | B1* | 4/2018 | Mochizuki | H01L 29/42392 |
| 9,954,102 | B1* | 4/2018 | Mochizuki | H01L 29/6653 |
| 10,283,601 | B2* | 5/2019 | Balakrishnan | H01L 21/02532 |
| 2002/0190274 | A1 | 12/2002 | Lung | |
| 2003/0086287 | A1 | 5/2003 | Salling et al. | |
| 2006/0234463 | A1* | 10/2006 | Avellan | H01L 29/66181 |
| | | | | 438/785 |
| 2017/0179128 | A1* | 6/2017 | Balakrishnan | H01L 21/823807 |
| 2017/0271500 | A1* | 9/2017 | Cheng | H01L 29/0673 |
| 2019/0229195 | A1* | 7/2019 | Balakrishnan | H01L 21/02636 |
| 2019/0378904 | A1* | 12/2019 | Yang | G11C 11/223 |
| 2020/0052124 | A1* | 2/2020 | Miao | H01L 27/088 |
| 2021/0028178 | A1* | 1/2021 | You | G11C 11/2275 |
| 2022/0285497 | A1* | 9/2022 | Kim | H01L 29/1083 |
| 2024/0014320 | A1* | 1/2024 | Mulaosmanovic | H01L 29/516 |

OTHER PUBLICATIONS

B. Zeng et al., "2-Bit/Cell Operation of Hf0.5Zr0.5O2 Based FeFET Memory Devices for NAND Applications," in IEEE Journal of the Electron Devices Society, vol. 7, pp. 551-556, 2019, doi: 10.1109/JEDS.2019.2913426.

Chung-Yu Wu and Liow Yu-Yee, "A new dynamic ternary sense amplifier for 1.5-bit/cell multi-level low-voltage CMOS DRAMs," 1999 IEEE International Symposium on Circuits and Systems (ISCAS), 1999, pp. 47-50 vol. 1, doi: 10.1109/ISCAS.1999.777802.

Y. Xu et al., "Improved Multi-bit Storage Reliablity by Design of Ferroelectric Modulated Anti-ferroelectric Memory," 2021 IEEE International Electron Devices Meeting (IEDM), 2021, pp. 6.2.1-6.2.4, doi: 10.1109/IEDM19574.2021.9720659.

H. Mulaosmanovic et al., "Evidence of single domain switching in hafnium oxide based FeFETs: Enabler for multi-level FeFET memory cells," 2015 IEEE International Electron Devices Meeting (IEDM), 2015, pp. 26.8.1-26.8.3, doi: 10.1109/IEDM.2015.7409777.

R. Carter et al., "22nm FDSOI Technology for Emerging Mobile, Internet-of-Things, and RF Applications," 2016 IEEE International Electron Devices Meeting (IEDM), 2016, pp. 2.2.1-2.2.4, doi: 10.1109/IEDM.2016.7838029.

S. Dünkel et al., "A FeFET based super-low-power ultra-fast embedded NVM technology for 22nm FDSOI and beyond," 2017 IEEE International Electron Devices Meeting (IEDM), 2017, pp. 19.7.1-19.7.4, doi: 10.1109/IEDM.2017.8268425.

Z. Jiang et al., "Asymmetric Double Gate Ferroelectric FET to Break the Tradeoff Between Thickness Scaling and Memory Window," accepted for VLSI2022; pp. 1-2; Proceedings of the IEEE Symposium on VLSI Technology and Circuits (VLSI'22), Hawaii, U.S., Jun. 2022.

B. Eitan, P. Pavan, I. Bloom, E. Aloni, A. Frommer and D. Finzi, "NROM: A novel localized trapping, 2-bit nonvolatile memory cell," in IEEE Electron Device Letters, vol. 21, No. 11, pp. 543-545, Nov. 2000, doi: 10.1109/55.877205.

German Patent and Trademark Office; Office Action issued in German Patent Application No. 102023123789.6 on Feb. 10, 2025; 10 pages.

* cited by examiner

US 12,268,019 B2

FERROELECTRIC FIELD-EFFECT TRANSISTORS WITH A HYBRID WELL

BACKGROUND

The disclosure relates to semiconductor device fabrication and integrated circuits and, more specifically, to structures including a ferroelectric field-effect transistor and methods of forming a structure including a ferroelectric field-effect transistor.

A field-effect transistor generally includes a source, a drain, a semiconductor body supplying a channel region between the source and drain, and a gate structure overlapped with the channel region. When a control voltage exceeding a characteristic threshold voltage is applied to a gate electrode of the gate structure, carrier flow occurs in the channel region between the source and drain to produce a device output current. A ferroelectric field-effect transistor is a type of field-effect transistor in which the gate structure includes a layer containing a ferroelectric material. The threshold voltage of the ferroelectric field-effect transistor depends on the polarization state of the ferroelectric layer.

Improved structures for a ferroelectric field-effect transistor and methods of forming a structure for a ferroelectric field-effect transistor are needed.

SUMMARY

In an embodiment of the invention, a structure comprises a semiconductor substrate, a semiconductor layer, a dielectric layer arranged between the semiconductor layer and the semiconductor substrate, and first and second wells in the semiconductor substrate. The first well has a first conductivity type, and the second well has a second conductivity type opposite to the first conductivity type. A ferroelectric field-effect transistor comprises a gate structure on the semiconductor layer over the first well and the second well. The gate structure includes a ferroelectric layer comprising a ferroelectric material.

In an embodiment of the invention, a method comprises forming first and second wells in a semiconductor substrate, and forming a ferroelectric field-effect transistor comprising a gate structure on a semiconductor layer over the first well and the second well. The first well has a first conductivity type, the second well has a second conductivity type opposite to the first conductivity type, a dielectric layer is arranged between the semiconductor layer and the semiconductor substrate, and the gate structure includes a ferroelectric layer comprising a ferroelectric material.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
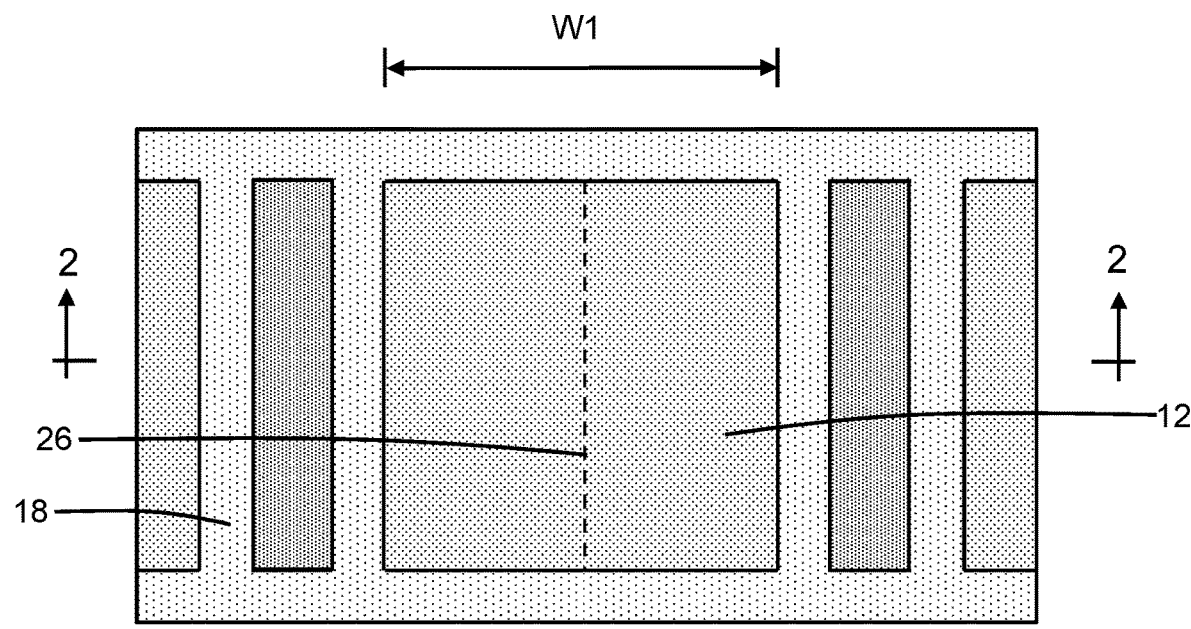
FIG. 1 is a top view of a structure at an initial fabrication stage of a processing method in accordance with embodiments of the invention.
Figure 2:
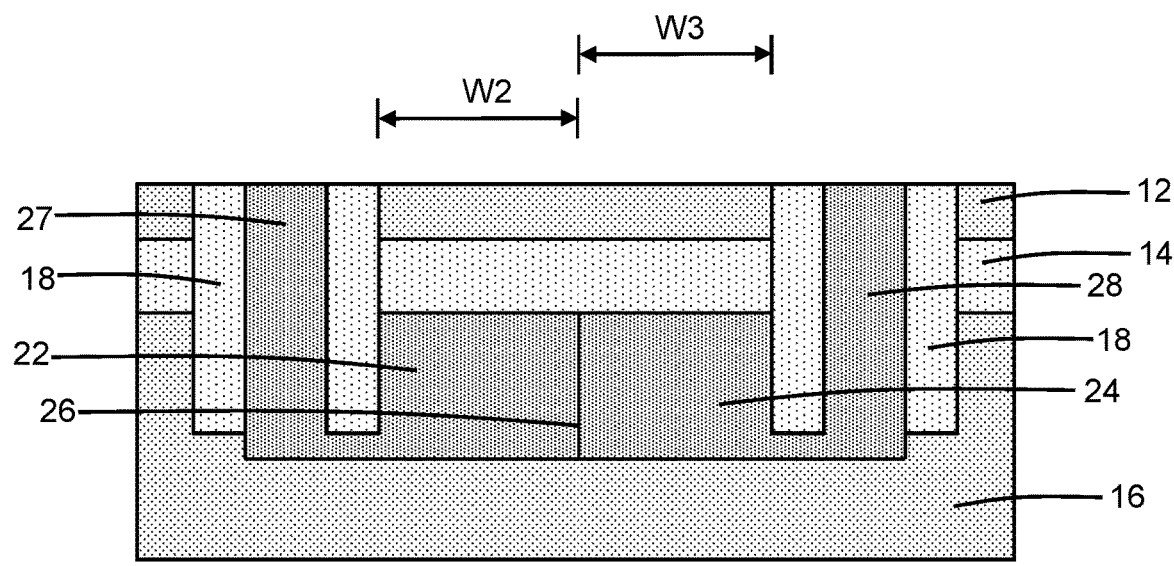
FIG. 2 is a cross-sectional view taken generally along line 2-2 in FIG. 1.

With reference to FIGS. 1, 2 and in accordance with embodiments of the invention, a substrate may include a semiconductor layer 12, a dielectric layer 14, and a semiconductor substrate 16 that is separated from the semiconductor layer 12 by the dielectric layer 14. The semiconductor substrate 16 may be comprised of a semiconductor material, such as single-crystal silicon. The dielectric layer 14 may be comprised of a dielectric material, such as silicon dioxide, that is an electrical insulator. The semiconductor layer 12 may be comprised of a semiconductor material, such as single-crystal silicon. The dielectric layer 14 has an upper interface with the semiconductor layer 12, the dielectric layer 14 has a lower interface with the semiconductor substrate 16, and the upper and lower interfaces are separated by the thickness of the dielectric layer 14. In an embodiment, the semiconductor layer 12, the dielectric layer 14, and the semiconductor substrate 16 may be integrated into a silicon-on-insulator (SOI) substrate.

Shallow trench isolation regions 18 may be formed by patterning shallow trenches in the semiconductor layer 12 that extend to the dielectric layer 14 and optionally into the semiconductor substrate 16, depositing a dielectric material, such as silicon dioxide, to fill the shallow trenches, and planarizing and/or recessing the deposited dielectric material. The shallow trench isolation regions 18 surround a portion of the semiconductor layer 12 defining an active device region in which a ferroelectric field-effect transistor is subsequently formed. The active device region of the semiconductor layer 12 may have a width dimension W1. The shallow trench isolation regions 18 also surround reach-through regions that are adjacent to the active device region and that may be formed in a hybrid area from which the semiconductor layer 12 and dielectric layer 14 are locally removed.

Wells 22, 24 may be formed in the semiconductor substrate 16. The wells 22, 24 are located in the semiconductor substrate 16 beneath (i.e., below) the dielectric layer 14, and the dielectric layer 14 is positioned in a vertical direction between the wells 22, 24 and the semiconductor layer 12. In an embodiment, the wells 22, 24 may adjoin the dielectric layer 14 along the lower interface with the semiconductor substrate 16. The well 24 is doped to have an opposite conductivity type from the well 22. The well 22 may adjoin the well 24 along an interface 26 across which the conductivity type changes to define a p-n junction. The wells 22, 24 can either be forward-biased or reverse-biased during operation.

In an embodiment, the well 22 may have a portion in the active device region with a width dimension W2, and the well 24 may have a portion in the active device region with a width dimension W3 that is substantially equal to a width dimension W2 of the well 22. In an embodiment, the width dimension W2 of the portion of the well 22 in the active device region may be equal to the width dimension W3 of the portion of the well 22 in the active device region. In an embodiment, the sum of the width dimension W2 and the width dimension W3 may be substantially equal to the width dimension W1. In an embodiment, the sum of the width dimension W2 and the width dimension W3 may be equal to the width dimension W1.

The well 22 may be formed by introducing a dopant by, for example, ion implantation into the semiconductor substrate 16. A patterned implantation mask may be formed on the top surface of the semiconductor layer 12 to define a selected area that is exposed for implantation. The implantation mask may include a layer of an organic photoresist that is applied and patterned to form an opening exposing the selected area on the top surface of the semiconductor layer 12 and determining, at least in part, the location and horizontal dimensions of the well 22 in the semiconductor substrate 16. The implantation mask, which is stripped following implantation, has a thickness and stopping power sufficient to block implantation in masked areas. The implantation conditions (e.g., ion species, dose, kinetic energy) may be selected to tune the electrical and physical characteristics of the well 22. In an embodiment, the well 22 may be doped with a concentration of an n-type dopant (e.g., arsenic or phosphorus) to provide n-type conductivity.

The well 24 may be formed by introducing a dopant by, for example, ion implantation into the semiconductor substrate 16. A patterned implantation mask may be formed on the top surface of the semiconductor layer 12 to define a selected area that is exposed for implantation. The implantation mask may include a layer of an organic photoresist that is applied and patterned to form an opening exposing the selected area on the top surface of the semiconductor layer 12 and determining, at least in part, the location and horizontal dimensions of the well 24 in the semiconductor substrate 16. The implantation mask, which is stripped following implantation, has a thickness and stopping power sufficient to block implantation in masked areas. The implantation conditions (e.g., ion species, dose, kinetic energy) may be selected to tune the electrical and physical characteristics of the well 24. In an embodiment, the well 24 may be doped with a concentration of a p-type dopant (e.g., boron) to provide p-type conductivity.

The wells 22, 24 of opposite conductivity types collectively define a hybrid or split well that is located in the semiconductor substrate 16 beneath the active device region of the semiconductor layer 12. The wells 22, 24 extend to a depth in the semiconductor substrate 16 that is greater than the depth of the shallow trench isolation regions 18. The reach-through regions are also doped when the wells 22, 24 are doped to define respective well contacts 27, 28 that are adjacent to the active device region. The well contact 27 is connected to the portion of the well 22 beneath the active device region by a portion of the well 22 extending beneath the shallow trench isolation regions 18. The well contact 28 is connected to the portion of the well 24 beneath the active device region by a portion of the well 24 extending beneath the shallow trench isolation regions 18. The active device region and the interface 26 are positioned in a lateral direction between the well contact 27 and the well contact 28.

Figure 3:
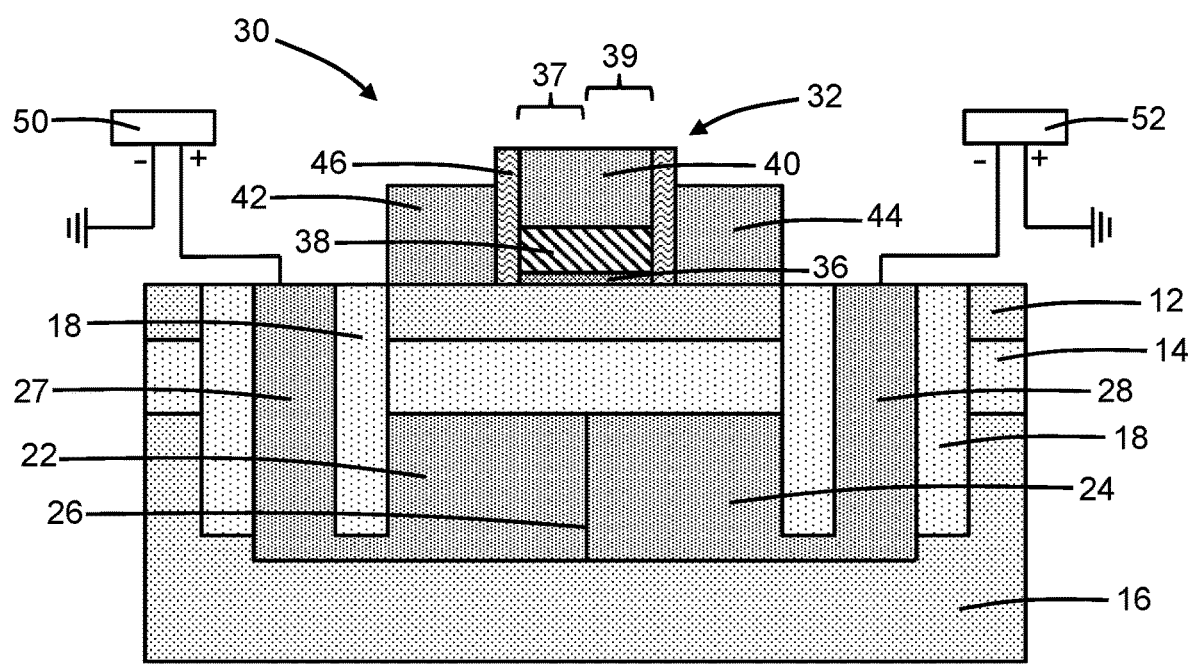
FIG. 3 is a cross-sectional view of the structure at a fabrication stage subsequent to FIGS. 1, 2.

With reference to FIG. 3 in which like reference numerals refer to like features in FIGS. 1, 2 and at a subsequent fabrication stage, a ferroelectric field-effect transistor 30 may be formed in the active device region of the semiconductor layer 12. The ferroelectric field-effect transistor 30 may include a multi-layer gate structure 32 and raised semiconductor layers 42, 44 providing source/drain regions. As used herein, the term "source/drain region" means a doped region of semiconductor material that can function as either a source or a drain of the ferroelectric field-effect transistor 30.

The gate structure 32 includes an interfacial layer 36 that is arranged on the semiconductor layer 12, a ferroelectric layer 38 that is arranged on the interfacial layer 36, and a gate electrode 40 that is arranged on the ferroelectric layer 38. The interfacial layer 36 is positioned in a vertical direction between the ferroelectric layer 38 and the semiconductor layer 12, and the ferroelectric layer 38 is arranged in a vertical direction between the gate electrode 40 and the interfacial layer 36. The interfacial layer 36 may be comprised of a dielectric material, such as silicon dioxide either grown or deposited, that is an electrical insulator. The ferroelectric layer 38 may be comprised of a ferroelectric material, such as a high-k dielectric material like hafnium oxide or zirconium oxide, that is deposited, for example, by atomic layer deposition. In an embodiment, the ferroelectric material of the ferroelectric layer 38, which is an electrical insulator, may have a permittivity that is greater than the permittivity of the dielectric material of the interfacial layer 36. The ferroelectric material constituting the ferroelectric layer 38 may be deposited and crystallized by an anneal following deposition. In an embodiment, the ferroelectric layer 38 may include crystalline grains characterized by an orthorhombic phase that is ferroelectric. The gate electrode 40 may include one or more conductor layers comprised of, for example, doped polysilicon or a metal. The gate structure 32 may be formed by forming a layer stack including thin films of the different materials and patterning the layer stack with photolithography and etching processes.

The gate structure 32 is positioned in a vertical direction over the interface 26 between the well 22 and the well 24 such that the ferroelectric layer 38 overlaps with the interface 26. As a result, the ferroelectric layer 38 includes a portion 37 that is positioned over the portion of the well 22 in the active device region, and the ferroelectric layer 38 includes a portion 39 that is positioned over the portion of the well 24 in the active device region. In an embodiment, the portions 37, 39 of the ferroelectric layer 38 may each constitute one-half of the ferroelectric layer 38 that are symmetrically arranged about the interface 26. In an embodiment, the ferroelectric layer 38 may be a singular layer that includes the different portions 37, 39 and, in that regard, may lack multiple layers of ferroelectric material that are stacked in a vertical direction. In an embodiment, the ferroelectric layer 38 may be a unitary layer in which the portions 37, 39 adjoin and are distinguished by their respective overlapping relationships with the portions of the wells 22, 24 in the active device region. The portion 37 may have a width that is less than the width W2 of the well 22, and the portion 39 may have a width that is less than the width W3 of the well 24.

The ferroelectric material constituting the ferroelectric layer 38 is characterized by a pair of stable remanent polarization states that are persistent and that can be reversibly varied in response to an electric field applied from the gate structure 32. The pair of stable remanent polarization states are appropriate for use in defining the logic states of a nonvolatile memory bitcell. In particular, the remnant polarization states of the ferroelectric material in the ferroelectric layer 38 determine threshold voltage shifts reflecting logic states stored by the ferroelectric field-effect transistor 30. In one remnant polarization state, the polarization of the ferroelectric material may be oriented parallel to the surface normal. In the other remnant polarization state, the polarization of the ferroelectric material may be oriented antiparallel to the surface normal. The ferroelectric field-effect transistor 30 may, for example, have a higher threshold voltage if the ferroelectric material is polarized parallel to the surface normal.

The raised semiconductor layers 42, 44 providing the source/drain regions may be formed on the semiconductor layer 12 adjacent to the opposite sides of the gate structure 32. The raised semiconductor layer 42 is located adjacent to the portion 37 of the ferroelectric layer 38, and the raised semiconductor layer 44 is located adjacent to the portion 39 of the ferroelectric layer 38. The raised semiconductor layers 42, 44 may be comprised of a semiconductor material, such as single-crystal silicon. The raised semiconductor layers 42, 44 may be formed by an epitaxial growth process and may be doped during epitaxial growth. The raised semiconductor layers 42, 44 may be doped to have the same conductivity type as either the well 22 or the well 24. In an embodiment, the raised semiconductor layers 42, 44 may be doped (e.g., heavily doped) with a concentration of a dopant, such as an n-type dopant (e.g., phosphorus or arsenic) to provide n-type conductivity. In an alternative embodiment, the raised semiconductor layers 42, 44 may be doped (e.g., heavily doped) with a concentration of a dopant, such as a p-type dopant (e.g., boron) to provide p-type conductivity.

Dielectric sidewall spacers 46 may be positioned in a lateral direction between the gate structure 32 and the raised semiconductor layers 42, 44. The dielectric sidewall spacers 46 and the gate structure 32 may self-align the formation of the raised semiconductor layers 42, 44.

The well 22 may be connected to a power supply 50, and the well 24 may be connected to a power supply 52. The power supplies 50, 52 may be configured to independently bias the wells 22, 24. The power supply 50 may be configured to supply a positive bias voltage to the well 22. For example, the positive bias voltage applied by the power supply 50 to the well 22 may be greater than 0 volts and less than or equal to +4 volts (i.e., positive 4 volts) relative to ground. The power supply 52 may be configured to supply a negative bias voltage to the well 24. For example, the negative bias voltage applied by the power supply 52 to the well 24 may be less than 0 volts and greater than or equal to −4 volts (i.e., negative 4 volts) relative to ground. The positive bias voltage applied to the well 22 and the negative bias voltage applied to the well 24 may be used to either reverse-bias or forward-bias the p-n junction at the interface 26.

For example, the programing of the portion 37 of the ferroelectric layer 38 may be inhibited by applying a bias of positive 2 volts to the well 22 and a bias of negative 4 volts to the well 24 during the application of a positive gate voltage (e.g., positive 2 volts) to program the portion 39. As another example, the programing of the portion 39 of the ferroelectric layer 38 may be inhibited by applying a vias of positive 4 volts to the well 22 and a bias of negative 2 volts to the well 24 during the application of a negative gate voltage (e.g., negative 2 volts) to program the portion 37. Both portions 37, 39 may be programmed to have a uniform polarization state by applying a positive gate voltage with both of the wells 22, 24 grounded, and a different uniform polarization state by applying a negative gate voltage with both of the wells 22, 24 grounded. In an embodiment, substantially all of the crystalline grains in the portion 37 of the ferroelectric layer 38 may have the same polarization state when programmed, substantially all of the crystalline grains in the portion 39 of the ferroelectric layer 38 may have the same polarization state when programmed, and these polarization states may differ or be the same.

The ferroelectric field-effect transistor 30 may have multiple different threshold voltages dependent upon the specific polarization states of the portions 37, 39 of the ferroelectric layer 38. In that regard, a set of voltages may be applied to bias the wells 22, 24 to inhibit a change in polarization state of one or the other of the portions 37, 39, when a gate voltage is applied as a pulse to the gate structure 32, such that the portion 37 and the portion 39 can have different polarization states. As a result of the ability to independently program the different portions 37, 39 of the ferroelectric layer 38, the ferroelectric field-effect transistor 30 may be characterized by more than two logic states. For example, the ferroelectric field-effect transistor 30 may be characterized by four logic states. In that regard, both of the portions 37, 39 may be programmed by a gate voltage (e.g., a positive gate voltage) with the wells 22, 24 grounded to be polarized parallel to the surface normal, both of the portions 37, 39 may be programmed by a gate voltage (e.g., a negative gate voltage) with the wells 22, 24 grounded to be polarized anti-parallel to the surface normal, the portion 37 may be inhibited against programming and the portion 39 may be programmed to be polarized anti-parallel to the surface normal with a set of voltages applied to wells 22, 24 and a gate voltage applied to the gate structure 32, and the portion 39 may be inhibited against programming and the portion 37 may be programmed to be polarized parallel to the surface normal with a different set of voltages applied to wells 22, 24 and a gate voltage applied to the gate structure 32.

The ferroelectric field-effect transistor 30 may be replicated and the replicated ferroelectric field-effect transistors 30 may be deployed in a memory array. The independent biasing of the wells 22, 24 may enable an increase the storage density, in terms of bits per unit area, of the memory array by permitting the ferroelectric field-effect transistor 30 to have more than two polarization states. The density increase may promote an overall cost reduction per bit of storage in a memory array.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate a range of +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a semiconductor substrate;
   a semiconductor layer;
   a dielectric layer arranged between the semiconductor layer and the semiconductor substrate;
   a first well in the semiconductor substrate, the first well having a first conductivity type;
   a second well in the semiconductor substrate, the second well having a second conductivity type opposite to the first conductivity type; and
   a ferroelectric field-effect transistor comprising a gate structure on the semiconductor layer over the first well and the second well, the gate structure including a ferroelectric layer comprising a ferroelectric material.

2. The structure of claim 1 wherein the first well and the second well adjoin along a p-n junction, and the ferroelectric layer is positioned to overlap with the p-n junction.

3. The structure of claim 2 wherein the ferroelectric layer includes a first portion that overlaps with the first well and a second portion that overlaps with the second well.

4. The structure of claim 3 wherein the first portion of the ferroelectric layer adjoins the second portion of the ferroelectric layer.

5. The structure of claim 1 further comprising:
   a first power supply coupled to the first well, the first power supply configured to supply a positive bias voltage to the first well.

6. The structure of claim 5 further comprising:
   a second power supply coupled to the second well, the first power supply configured to supply a negative bias voltage to the second well.

7. The structure of claim 6 wherein the positive bias voltage is greater than 0 volts and less than or equal to 4 volts, and the negative bias voltage is less than 0 volts and greater than or equal to negative 4 volts.

8. The structure of claim 1 wherein the first well is configured to receive a positive bias voltage.

9. The structure of claim 8 wherein the second well is configured to receive a negative bias voltage.

10. The structure of claim 9 wherein the positive bias voltage is greater than 0 volts and less than or equal to 4 volts, and the negative bias voltage is less than 0 volts and greater than or equal to negative 4 volts.

11. The structure of claim 1 wherein the ferroelectric layer is a singular layer.

12. The structure of claim 1 wherein the ferroelectric material is hafnium oxide or zirconium oxide.

13. The structure of claim 1 wherein the dielectric layer is a buried oxide layer of a silicon-on-insulator substrate.

14. The structure of claim 1 wherein the ferroelectric field-effect transistor comprises a first source/drain and a second source/drain, the ferroelectric layer includes a first portion adjacent to the first source/drain, the first portion of the ferroelectric layer overlaps with the first well, the ferroelectric layer includes a second portion adjacent to the second source/drain, and the second portion of the ferroelectric layer overlaps with the second well.

15. The structure of claim 14 wherein the first well and the second well adjoin along a p-n junction, the ferroelectric layer is positioned to overlap with the p-n junction, and the p-n junction is positioned in a lateral direction between the first source/drain and the second source/drain.

16. The structure of claim 14 wherein the first portion of the ferroelectric layer adjoins the second portion of the ferroelectric layer.

17. The structure of claim 1 further comprising:
   a first well contact connected to the first well, the first well contact having the first conductivity type; and
   a second well contact connected to the second well, the second well contact having the second conductivity type.

18. The structure of claim 17 wherein the first well and the second well adjoin along a p-n junction, and p-n junction is positioned in a lateral direction between the first well contact and the second well contact.

19. The structure of claim 17 wherein the first well and the second well adjoin along a p-n junction, the ferroelectric layer includes a first portion positioned over a portion of the first well, the ferroelectric layer includes a second portion positioned over a portion of the second well, and the first portion and the second portion are symmetrically arranged about the p-n junction.

20. A method comprising:
   forming a first well and a second well in a semiconductor substrate, wherein the first well has a first conductivity type, and the second well has a second conductivity type opposite to the first conductivity type; and
   forming a ferroelectric field-effect transistor comprising a gate structure on a semiconductor layer over the first well and the second well, wherein a dielectric layer is arranged between the semiconductor layer and the semiconductor substrate, and the gate structure includes a ferroelectric layer comprising a ferroelectric material.

* * * * *

UNITED STATES PATENT AND TRADEMARK OFFICE
CERTIFICATE OF CORRECTION

| | | |
|---|---|---|
| PATENT NO. | : 12,268,019 B2 | Page 1 of 1 |
| APPLICATION NO. | : 17/960245 | |
| DATED | : April 1, 2025 | |
| INVENTOR(S) | : Stefan Dünkel et al. | |

It is certified that error appears in the above-identified patent and that said Letters Patent is hereby corrected as shown below:

In the Claims

Column 7, Claim 6, Line 51 reads:
"first power supply configured to supply a negative bias"
It should read:
-- second power supply configured to supply a negative bias --

Signed and Sealed this
Twenty-ninth Day of April, 2025

Coke Morgan Stewart
*Acting Director of the United States Patent and Trademark Office*